United States Patent [19]

Brown

[11] 4,424,479

[45] Jan. 3, 1984

[54] LOOP FAULT LOCATION

[75] Inventor: James M. Brown, Chatham, N.J.

[73] Assignee: Bell Telephone Laboratories, Incorporated, Murray Hill, N.J.

[21] Appl. No.: 308,417

[22] Filed: Oct. 5, 1981

[51] Int. Cl.³ .......................... G01R 31/08; H04B 3/46
[52] U.S. Cl. ................................ 324/52; 179/175.3 F
[58] Field of Search .................................. 324/52, 51; 179/175.3 R, 175.3 F

[56] References Cited

U.S. PATENT DOCUMENTS 3,234,459  2/1966  Brazee .................................... 324/52
3,248,646  4/1966  Brazee .................................... 324/52

OTHER PUBLICATIONS

Maloney, "Locating Cable Faults", IEE Trans. on Industry Appls., vol. IA-9, No. 4, Jul./Aug. 1973, pp. 380-394.

Primary Examiner—Ernest F. Karlsen
Assistant Examiner—Jose M. Solis
Attorney, Agent, or Firm—J. T. Peoples

[57] ABSTRACT

Circuitry, and associated methodology, for locating resistive shunt faults on a cable pair comprises DC source (120) and current sensors (121,122) which provide measured information utilized to estimate the resistance of the pair between the fault and a test position. In locating faults of a single-sided nature, two sets of measurements, either absolute or ratio type, are effected from the test position with the pair shorted at a point beyond the fault. In locating double-sided faults, three sets of current dependent measurements are taken at the measurement point. A reference pair is required for double-sided faults, and various strapping arrangements between the pair under test and the reference pair are required at a point beyond the fault depending on the required set of measurements.

5 Claims, 8 Drawing Figures

LOOP FAULT LOCATION

TECHNICAL FIELD

This invention relates generally to fault troubleshooting in a multipair cable and, more particularly, to apparatus and associated methodology for locating one-sided and two-sided resistive shunt faults affecting a cable pair.

BACKGROUND OF THE INVENTION

In telephone loops, a variety of faults occur from time to time which must be detected, located and repaired. Principally, these include: one-sided faults (either the tip or ring of a pair from a cable is faulted at a point) such as an open or a ground; and two-sided faults (both tip and ring of the pair are faulted at a point) such as a short between the pair or opens in both conductors of the pair. These faults may trace to manufacturing irregularities or, more usually, to physical damage during cable usage.

Faults causing large discontinuities in the transmission medium, such as solid shorts or opens, can be detected and localized rather expeditiously because of their deleterious effects on the medium. However, less severe faults of only a service degrading nature, such as high resistance leakages caused, for example, by water contamination of a cable core, have traditionally required considerable time and expense to locate and repair.

The article entitled "Locating Cable Faults," by C. A. Maloney, *IEEE Transactions on Industry Applications*, July/August 1973, particularly pages 385 and 386, is representative of prior art techniques utilized to locate resistive shunt faults. The conventional techniques, and usual variations thereon, employ bridge-type measurements to yield voltage outputs which are a measure of the electrical distance to the fault. With a bridge measurement, craftsperson interaction is required to manipulate bridge controls and thereby effect a balanced bridge condition. Such procedures, while satisfactory for some present-day applications such as fault localization activities, are not compatible with computer-controlled testing approaches. Automated, rapid-testing arrangements generally preclude procedures requiring time-consuming craftsperson manipulations and interactions.

SUMMARY OF THE INVENTION

The prior art shortcomings, deficiencies and incompatibilities are obviated, in accordance with the present invention, by improved cable testing arrangements, and associated methods, that locate, respectively, single- and double-sided resistive shunt faults.

With respect to single-sided faults, the improvement comprises circuitry operating sequentially in two modes. In the first mode, with the pair under test shorted at the far-end, that is, at a point past the fault, a DC voltage source is applied to the pair in a longitudinal fashion at the near-end, typically from the central office. In the preferred embodiment, two current values are measured, namely, the current on the good wire of the pair and the differential current represented by the difference between the currents flowing in both wires. In the second mode, with the far-end still shorted, the source is applied to the good wire and the faulted wire is grounded. In the preferred embodiment, the current in each wire is measured. The resistance of one of the wires between the measurement location and the fault is then evaluated from the values of the voltage source and the four measured currents.

Regarding double-sided faults, the improvement comprises a circuit configuration having three modes operated sequentially. In each of the modes, a reference pair is required. Also, since each of the five possible two-sided faults may be represented by an equivalent T-network having series resistance arms representing the resistances, respectively, between the near-end and the fault point and the fault point and the far-end and a shunt arm resistance representing the fault resistance to ground, the summary is couched in terms of this T-network representation. In the first measurement mode, a DC voltage source is connected to one wire of the reference pair; the other wire of the reference pair is connected to the near-end series arm of the T-network. In the preferred embodiment, the current flow in each reference wire is measured with the three far-end terminals shorted. In the second mode with the far-ends shorted, the DC source is connected to one wire from the reference pair as well as the input to the T-network and, in the preferred embodiment, the current flow into each wire is measured. Finally, in the third mode, with the far-end still shorted, the DC source is connected to the same reference wire as in the second measurement mode and the T-network wire is grounded. The current flow in each wire is measured in the preferred embodiment. The series resistance of the arm between the measurement point and the fault may then be evaluated from the values of the source and the six measured currents.

One feature of the single- and double-sided fault locating arrangements is that the resulting resistance estimates are not influenced by any ground potential associated with the faults. Moreover, the estimates are also independent of any changes in the fault resistance occurring during the interval required to make the measurements. This is important because faults caused by water contamination may have fluctuating resistance values.

BRIEF DESCRIPTION OF THE DRAWING

The organization and operation of this invention will be better understood from a consideration of detailed descriptions of an illustrative embodiment for, respectively, a single-sided and a double-sided fault condition, which follow, when taken in conjunction with the accompanying drawings.

DETAILED DESCRIPTION

In elucidating the particulars of the illustrative embodiment, single-sided faults are discussed with reference to FIGS. 1 and 2 whereas the discussion of double-sided faults focuses on FIGS. 3–8.

1. Single-Sided Resistive Faults

Figure 1:
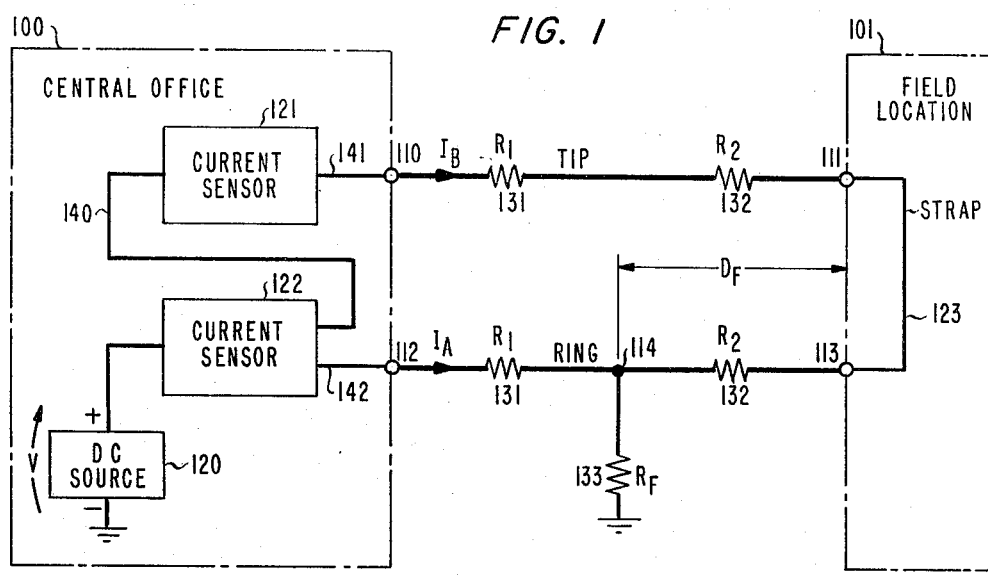
FIG. 1 is a schematic diagram depicting the first measurement mode of an illustrative embodiment of the single-side fault location tester.
Figure 2:
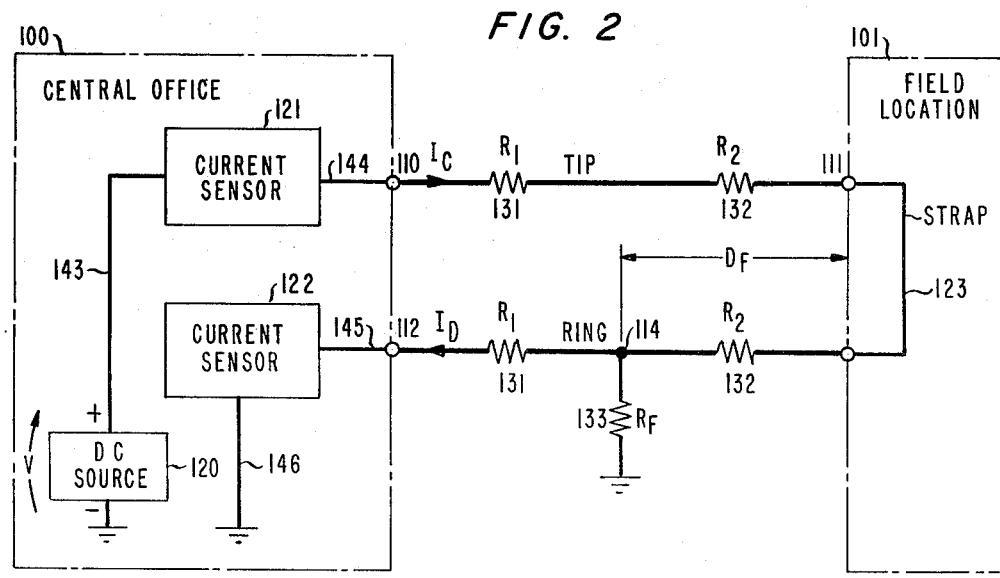
FIG. 2 is a schematic diagram depicting the second measurement mode of the illustrative embodiment corresponding to FIG. 1.

Without loss of generality, the case of either the TIP conductor or RING conductor faulted to ground through a high resistance is depicted by FIGS. 1 and 2. The good wire of the pair, which is presumed to be the TIP wire, is shown as the series connection between nodes 110 and 111. The faulted wire runs between nodes 112 and 113. Fault resistance $R_F$, represented by resistor 133, connects node 114 of the RING to ground, that is, node 114 is the point of the fault. The value of resistance $R_F$ remains an unknown throughout testing. The DC resistance $R_1$ of the faulted wire between test position 100, usually the telephone central office, and node 114 is represented by resistor 131. Similarly, the DC resistance $R_2$ of the faulted wire between field location 101, which is a convenient access point such as a cross-connect box or a pedestal, is represented by resistor 132. both $R_1$ and $R_2$ are unknown prior to fault location measurements. Once $R_2$ (or $R_1$) is determined from the measurements, and presuming the gauge of the faulted wire is known, the electrical distance $D_F$ between nodes 113 and 114 may be estimated. Based on this estimate, appropriate craft personnel may be dispatched to localize and repair the fault.

At field location 101, shorting strap 123 is placed between TIP and RING by a craftsperson prior to the fault sectionalizing measurements. At test position 100, two sets of measurements are effected. The arrangement of DC voltage source 120 and current sensors 121 and 122 in FIG. 1 provides one set of measurements. Similarly, the arrangement of source 120 and sensors 121 and 122, as depicted in FIG. 2, produces the second set of measurements.

With reference to FIG. 1, source 120, having DC voltage value V, drives node 110 of the TIP via the series arrangement of differential sensor 122, lead 140, sensor 121 and lead 141. Sensor 121 measures the current $I_B$ which flows into node 110. Source 120 also drives node 112 via the cascade arrangement of sensor 122 and lead 142. Sensor 122 is adapted to measure the differential current $I_A - I_B$ where $I_A$ is the current into node 112.

Referring now to FIG. 2, source 120 is again connected to node 110 through sensor 121 via leads 143 and 144; sensor 121 measures the current $I_C$ flowing into node 110. Current sensor 122, connecting node 112 to ground via leads 145 and 146, measures the current $I_D$ flowing from node 112.

Using simple circuit analysis techniques, it may then be shown that $$R_2 = \frac{\frac{V}{2I_C}((I_A - I_B)/I_B)}{I_A/I_B + I_D/I_C}. \tag{1}$$

Although the discussion to this point has been couched in terms of measurements involving absolute and differential current flows, it is apparent from perusal of equation (1) that certain ratios involving currents and the source voltage may also be measured to produce similar results.

2. Double-Sided Resistive Faults

Figure 3:
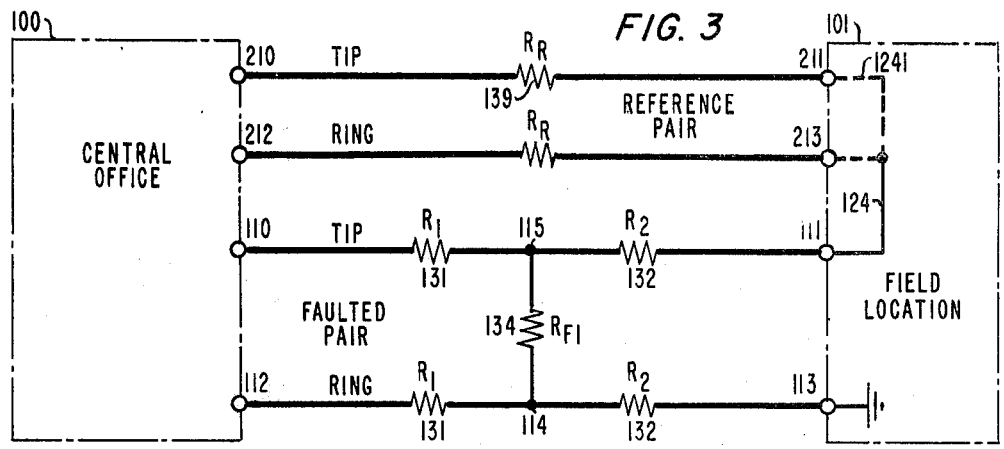
FIG. 3 is a schematic diagram depicting the connections made at the field location to produce an equivalent T-network representation of the faulted pair for the case of a two-sided shunt fault.

There are five types of double-sided faults, any one of which may occur at the fault point. FIG. 3 depicts the first type wherein a shunt resistive fault connects node 114 on the RING with node 115 on the TIP; the fault resistance value is denoted $R_{F1}$ and is represented by resistor 134. Since there is no direct path to ground with this fault condition, one is induced at field location 101 by connecting, for example, the end of the RING (node 113) to ground.

When a fault involves both the TIP and RING conductors, a reference pair must be used during the measurements in order to estimate resistance $R_2$, that is, the resistance of a faulted wire between the fault location and far-end location 101. As shown in FIG. 3, the DC resistance of each wire comprising the reference pair is denoted $R_R$ and is represented by resistor 139. In addition to inducing the ground condition at field location 101, the TIP end of the faulted pair (node 111) is shorted, via strap 124, to the RING end of the reference pair (node 213) and to the TIP end (node 211), via strap 1241, depending on the measurement required, as will be explained shortly.

Figure 4:
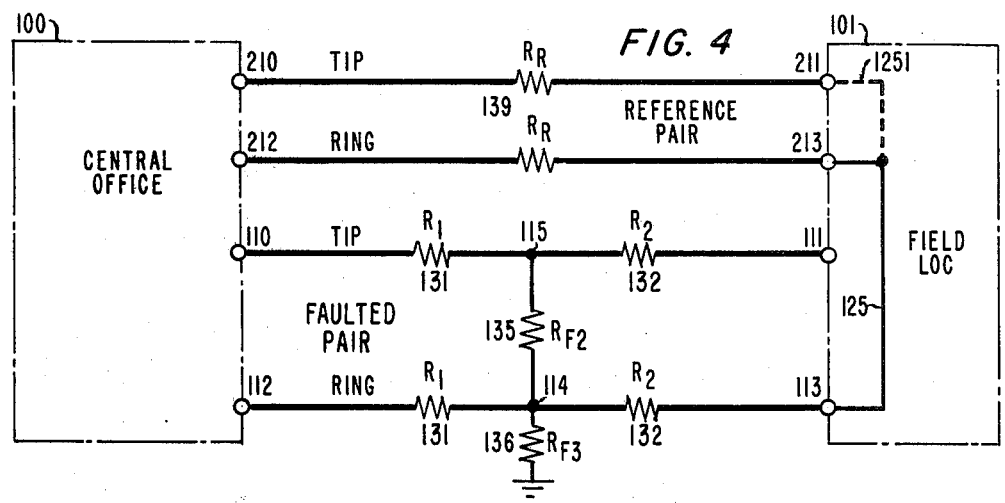
FIG. 4 is a schematic diagram depicting the connections made at the field location to produce an equivalent T-network representation of the faulted pair for the case of a shunt-ground fault.

FIG. 4 depicts the second and third types of double-sided faults wherein a defect links both the TIP and RING conductors as well as either the TIP or RING and ground. Since a ground path already exists (from node 114 on the RING through fault resistor 136, of value $R_{F3}$, to ground), there is no need to artificially induce a ground path at location 101 as required previously in treating the fault of FIG. 3. However, as before, strap 125 shorts RING node 113 to the reference RING node 213 and strap 1251, when required, shorts nodes 113 and 213 to reference TIP node 211. The measuring arrangement requiring placement of strap 1251 will also be discussed shortly.

Figure 5:
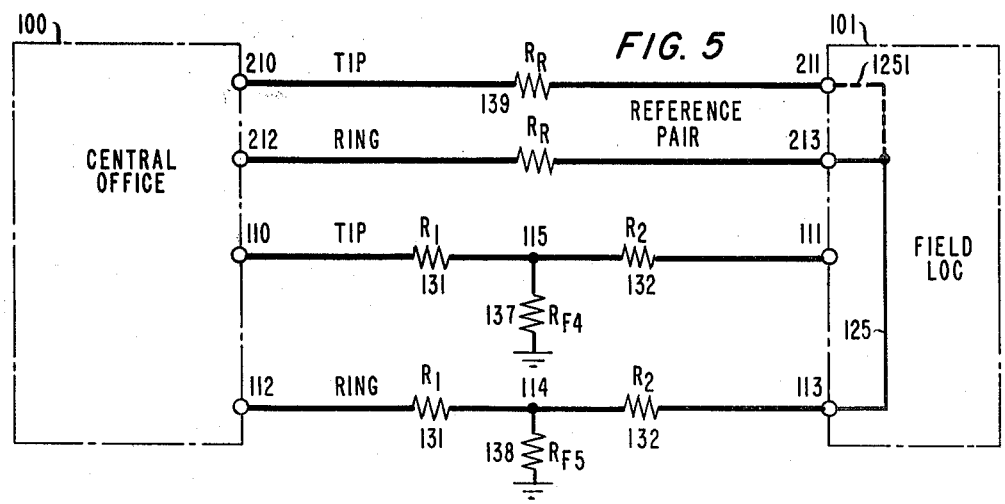
FIG. 5 is a schematic diagram depicting the connections made at the field location to produce an equivalent T-network representation of the faulted pair for the case of a ground-ground fault.

FIG. 5 represents the fourth fault condition wherein the TIP and RING wires of the faulted pair are separately coupled to ground via nodes 115 and 114 and resistors 137 ($R_{F4}$) and 138 ($R_{F5}$), respectively. A connection similar to that of FIG. 4 is effected at field position 101 via straps 125 and 1251.

The fifth and last fault condition is a composite of the faults shown in FIGS. 3 and 5, namely, a resistance links each wire of the faulted pair as well as each wire and ground. The reference and faulted pairs are connected at location 101 in the manner already shown in FIGS. 4 and 5.

In each of the five fault cases, it is possible, without loss of generality, to represent the faulted pair by an equivalent T-network having series arms represented, respectively, by $R_1$ and $R_2$ and a shunt arm having a fault resistance as one of its components. Resistance $R_1$ is the DC resistance of one of the faulted wires between test position 100 and the fault point whereas resistance $R_2$ is the DC resistance between the fault point and field position 101. Thus, for example, the faulted pair of FIG. 3 may be translated to the equivalent T-network representation as shown in FIGS. 6, 7 or 8 and labeled "Equivalent of Faulted Pair." In particular, the shunt arm resistance $R_{FD}$ (resistor 130), equals the sum of $R_{F1}$ and $R_2$.

Figure 6:
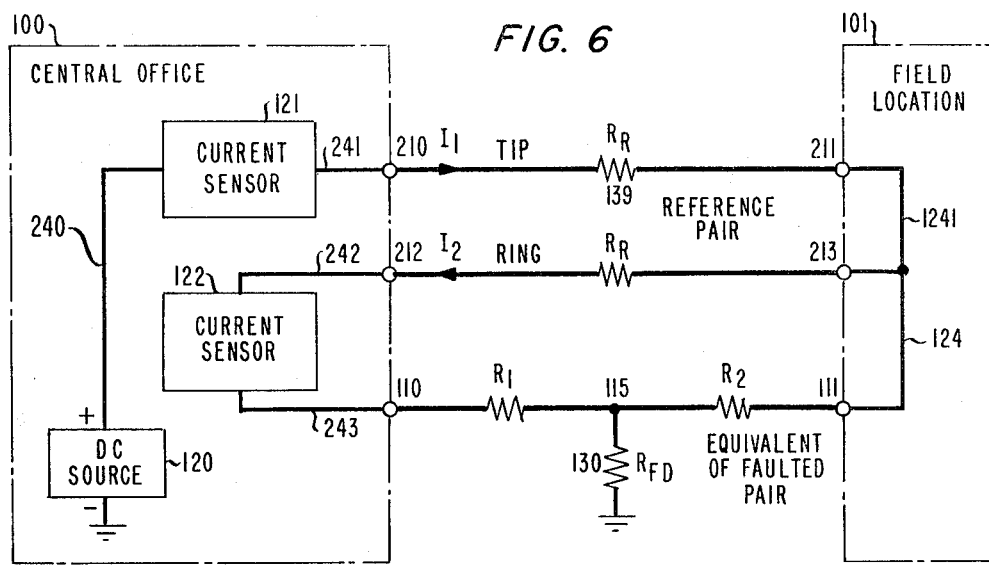
FIG. 6 is a schematic diagram depicting the first measurement mode of an illustrative embodiment of the double-sided fault location tester.
Figure 7:
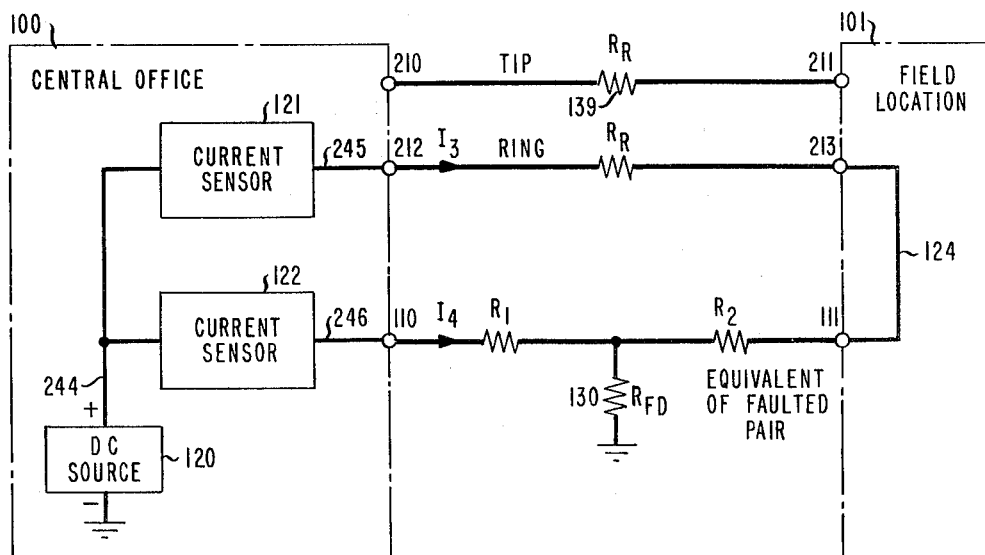
FIG. 7 is a schematic diagram depicting the second measurement mode of the illustrative embodiment corresponding to FIG. 6.
Figure 8:
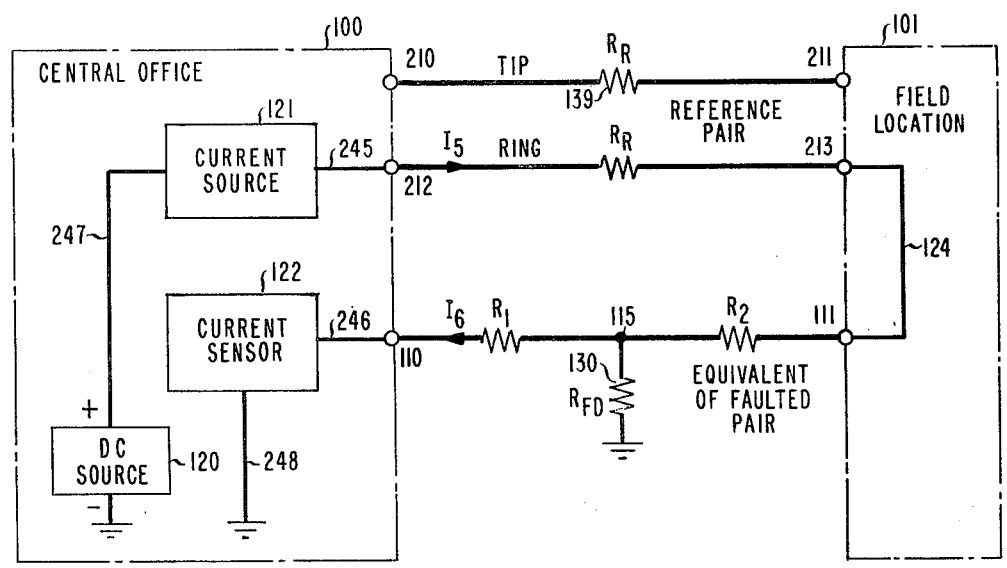
FIG. 8 is a schematic diagram depicting the third measurement mode of the illustrative embodiment corresponding to FIG. 6.

In order to estimate resistance $R_2$, three sets of measurements are effected at test position 100; the arrangements depicted by FIGS. 6, 7 and 8 show the endpoint interconnections required, respectively, for each set of measurements.

With reference to FIG. 6, all three nodes 111, 211 and 213 are shorted at field location 101 via straps 124 and 1241. Node 111 is the far-end terminal of the equivalent T-network representation of the faulted pair. At test position 100, source 120, having DC voltage value V, drives node 210 of the reference TIP via the series arrangement of lead 240, current sensor 121 and lead 241. Sensor 121 measures the current $I_1$ which flows into node 210. Current sensor 122, connected between reference RING node 212 and near-end node 110 of the T-network representation via leads 242 and 243, respectively, measures current flow $I_2$ from node 212.

Referring now to FIG. 7, source 120 is arranged to drive node 212 through the series connection of lead 244, sensor 121 and lead 245; sensor 121 measures the current flow into node 212. Source 120 is also arranged to simultaneously drive node 110 via the interposed cascade network comprising lead 244, sensor 122 and lead 246; sensor 122 measures the current $I_4$ flowing into node 110. Throughout this set of measurements, far-end nodes 111 and 213 are shorted via strap 124.

The last set of measurements is obtained from the arrangement of FIG. 8. With far-end nodes 111 and 213 still shorted, source 120 is connected to drive current $I_5$ into node 212 via the series circuit of lead 247, sensor 121 and lead 245; sensor 121 measures current $I_5$. Current sensor 122, connecting node 110 to ground via leads 246 and 248, measures current $I_6$ flowing from node 110.

Using simple circuit analysis techniques, it may then be shown that $$R_2 = \frac{I_2}{I_1}\left[\frac{\frac{V}{I_5}(1 + I_4/I_3)}{I_6/I_5 + I_4/I_3}\right]. \quad (2)$$

Again, as was discussed for the case of single-sided measurements, it is possible to measure certain ratios of voltages and currents, rather than absolute values, and thereby produce essentially the same results.

It is to be further understood that the cable pair testing arrangements, and associated methodology, described herein is not limited to the specific forms disclosed by way of example and illustration, but may assume other embodiments limited only by the scope of the appended claims.

What is claimed is:

1. Wire-pair apparatus for testing a single-sided fault ($R_F$) coupled to ground and located between first (101) and second (100) test positions along a wire-pair have a good wire (TIP) and a faulty wire (RING) and for determining the resistance ($R_2$) between said fault and said first test position, said apparatus characterized by means (123) at said first position for shorting said pair; and means (120-122,140-146) at said second position comprising a DC voltage source (120), of a preselected value (V) referenced to said ground, shunt means (121,122,140-142) for applying said source simultaneously to said wires and means (121 and 122) for measuring the DC current ($I_B$) in said good wire and the current difference ($I_A-I_B$) between the DC currents flowing in both said wires, and serial means (121,122,143-146), operatively alternately with said shunt means, for applying said source to said good wire and means (121 and 122) for measuring the DC current ($I_C$) in said good wire and the DC current ($I_D$) in said faulty wire (RING), wherein said resistance ($R_2$) is given by $$R_2 = \frac{\frac{V}{2I_C}((I_A - I_B)/I_B)}{\frac{I_A}{I_B} + \frac{I_D}{I_C}}.$$

2. Circuitry for testing a cable pair (TIP,RING) for a resistive fault-to-ground ($R_F$) on one wire (RING) located between a strapping (123) location (101) and a test position (100) to determine the resistance ($R_2$) between said fault and said strapping location, said apparatus characterized by a DC voltage source (120) of preselected value (V) with respect to said ground, longitudinal means (121,122,140-142) for applying said source simultaneously to said pair and for measuring the current difference ($I_A-I_B$) between the current flow ($I_A$) into said one wire and the current flow ($I_B$) into the mate (TIP) of said one wire, and metallic means (121,122,143-146), operating alternately with said longitudinal means, for aplying said source to said mate and grounding said one wire and for measuring: (i) the current ratio ($I_D/I_C$) between the current flow ($I_D$) from said one wire and the current flow ($I_C$) into said mate; and (ii) the resistance ratio ($V/I_C$) between said value of said source and said current into said mate, wherein said resistance ($R_2$) is given by $$R_2 = \frac{\frac{V}{2I_C}((I_A - I_B)/I_B)}{\frac{I_A}{I_B} + \frac{I_D}{I_C}}.$$

3. A method for testing a cable pair (TIP,RING) for a resistive fault-to-ground ($R_F$) on one wire (RING) located between a strapping (123) location (101) and a test position to determine the resistance ($R_2$) between said fault and said strapping location, said method characterized by the steps of applying a DC voltage source (120) of preselected value (V) with respect to ground simultaneously to said pair, measuring the differential current ($I_A-I_B$) between the current flow ($I_A$) into said one wire and the current flow ($I_B$) into the mate (TIP) of said one wire, then applying said source to said mate and grounding said one wire, measuring the current ratio ($I_D/I_C$) between the current flow ($I_D$) from said one wire and the current flow ($I_C$) into said mate and the resistance ratio ($V/I_C$) between said value of said source and said current in said mate, and evaluating the expression $$R_2 = \frac{\frac{V}{2I_C}((I_A - I_B)/I_B)}{\frac{I_A}{I_B} + \frac{I_D}{I_C}}$$

to determine said resistance ($R_2$).

4. Wire-pair apparatus for testing a double-sided fault ($R_{FD}$) to ground located between first (101) and second (100) test positions along one wire (TIP) of a faulted pair (TIP, RING) to determine the resistance ($R_2$) between said fault and said first test position, said apparatus utilizing first (reference TIP) and second (reference RING) reference wires connected between said positions, and said apparatus characterized by means (124,1241) at said first test position having three modes operated sequentially for shorting said one wire to said first and second reference wires in the first of said modes and to said second reference wire in the second and third of said modes, means (120-122,240-248) at said second position having three sequential testing modes corresponding to said three operational modes and comprising a DC voltage source (V, 120) referenced to said ground and first (121) and second (122) current sensors wherein in said first mode, said source is applied to said first reference wire through said first current sensor to measure the current ($I_1$) in said first reference wire, and said second reference wire and said one wire are connected in series through said second sensor to measure the current ($I_2$) in said series connection, in said second mode, said source is simultaneously applied to said second reference wire through said first current sensor to measure the current ($I_3$) in said second reference wire and to said one wire through said second current sensor to measure the current ($I_4$) in said one wire, and in said third mode, said source is applied to said second reference wire through said first current sensor to measure the current ($I_5$) in said second reference wire and said one wire is connected to said ground through said second current sensor to measure the current ($I_6$) in said one wire, and wherein said resistance ($R_2$) is given by $$R_2 = \frac{I_2}{I_1}\left[\frac{\frac{V}{I_5}(1 + I_4/I_3)}{I_6/I_5 + I_4/I_3}\right].$$

5. A method for testing a cable pair (TIP,RING) for a resistive, doubled-sided fault ($R_{FD}$) located between a first (101) test position and a second (100) test position to determine the resistance ($R_2$) between said fault and said first test position, said method utilizing a first reference wire (reference TIP) and a second reference wire (reference RING) connected between said positions, said method characterized by the steps of (i) shorting said first reference wire and said second reference wire to one wire of said pair at said first position and connecting said second reference wire to said one wire at said second position, (ii) applying a DC voltage source (120) of preselected value (V) to said first reference wire at said second test position, (iii) measuring, at said second test position, the current flow ($I_1$) into said first reference wire and the current flow ($I_2$) from said second reference wire, then (iv) disconnecting said second reference wire from said one wire at said second position and applying said source simultaneously to said second reference wire and said one wire at said second test position, (v) measuring, at said second test position, the current flow ($I_3$) into said second reference wire and the current flow ($I_4$) into said one wire, then (vi) applying said source to only said second reference wire and grounding said one wire at said second location, (vii) measuring, at said second location, the current flow ($I_5$) into said second reference wire and the current flow ($I_6$) from said one wire, and (viii) evaluating the expression $$R_2 = \frac{I_2}{I_1}\left[\frac{\frac{V}{I_5}(1 + I_4/I_3)}{I_6/I_5 + I_4/I_3}\right]$$

to determine said resistance ($R_2$).

* * * * *